(12) United States Patent
Grouell et al.

(10) Patent No.: US 7,283,371 B1
(45) Date of Patent: Oct. 16, 2007

(54) DEVICE CARRIER SYSTEM

(75) Inventors: William L. Grouell, San Ramon, CA (US); David M. Bradley, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 144 days.

(21) Appl. No.: 10/800,121

(22) Filed: Mar. 12, 2004

(51) Int. Cl.
*H05K 1/14* (2006.01)
*H05K 7/14* (2006.01)

(52) U.S. Cl. .................. 361/741; 361/756; 361/797; 361/801; 361/802

(58) Field of Classification Search .............. 174/52.1, 174/50, 54, 57, 59, 61; 361/801, 752, 741, 361/756, 797, 802; 439/152, 160
See application file for complete search history.

(56) References Cited

U.S. PATENT DOCUMENTS

| | | | |
|---|---|---|---|
| 4,445,740 A | 5/1984 | Wallace | |
| 4,982,303 A | 1/1991 | Krenz | |
| 5,010,426 A | 4/1991 | Krenz | |
| 5,317,481 A | 5/1994 | Hillis et al. | |
| 5,325,263 A | 6/1994 | Singer et al. | |
| 5,442,502 A | 8/1995 | Shimizu | |
| 5,586,003 A | 12/1996 | Schmitt et al. | |
| 5,631,808 A * | 5/1997 | Collins, III | ................. 361/801 |
| 5,668,696 A | 9/1997 | Schmitt | |
| 5,675,475 A * | 10/1997 | Mazura et al. | .............. 361/798 |
| 5,721,669 A | 2/1998 | Becker et al. | |
| 5,751,559 A | 5/1998 | Jensen et al. | |
| 5,959,956 A | 9/1999 | Takishima | |
| 5,975,735 A | 11/1999 | Schmitt | |
| 6,067,225 A | 5/2000 | Reznikov et al. | |
| 6,272,005 B1 | 8/2001 | Jensen et al. | |
| 6,288,911 B1 | 9/2001 | Aoki et al. | |
| 6,325,353 B1 | 12/2001 | Jiang | |
| 6,332,658 B1 | 12/2001 | Sato et al. | |
| 6,378,965 B1 | 4/2002 | Reznikov et al. | |
| 6,394,509 B1 | 5/2002 | Kurek, III | |
| 6,411,505 B1 | 6/2002 | DiFonzo et al. | |
| 6,411,517 B1 | 6/2002 | Babin | |
| 2003/0039100 A1 | 2/2003 | Salinas | |
| 2005/0047075 A1 | 3/2005 | Roesner | |

* cited by examiner

*Primary Examiner*—Hung V. Ngo
(74) *Attorney, Agent, or Firm*—Martine Penilla & Gencarella, LLP

(57) ABSTRACT

A component device carrier system includes a component device frame, a component device collar, and a clocked gear assembly providing motion in at least two directions. The component device collar is disposed around a component device. The component device collar is received in the component device frame to guide and position the component device. Gears on the component device frame mesh with the clocked gear assembly to enable motion in the at least two directions for positioning and securing the component device and for connecting and disconnecting the component device. A component carrier blade supports and arranges a plurality of component devices in at least one linear array.

21 Claims, 14 Drawing Sheets

DEVICE CARRIER SYSTEM

CROSS REFERENCE TO RELATED APPLICATION

This application is related to U.S. patent application Ser. No. 10/800,095, filed on the same day as the instant application and entitled "COMPONENT ARRAY BRACKET ASSEMBLY." The related application is hereby incorporated by reference in its entirety for all purposes.

BACKGROUND OF THE INVENTION

1. Field of the Invention

The present invention relates generally to device or component mounting and positioning, and more specifically to a component device bracket and carrier system that provides for the component device to be installed into and removed from an array of component devices.

2. Description of the Related Art

Computer network server systems and related components are typically housed in racks configured to assimilate a plurality of component devices. System racks provide efficient organization for the plurality of components for ease of access, serviceability, expandability, power distribution, cooling, etc.

As is known, various system and network component devices require electrical connection as well as data connections to implement RAID array, mirroring, or other such redundancy of data and power. As used herein, a "component device" is generally a singular component of a system, exemplified by devices such as network servers, routers, disk drive and other mass storage devices, tape back-up devices, and other similar related component devices, but may also be any type of device with or without an electrical connection. In the example of disk drives, the component devices are being developed in smaller and smaller dimension while accommodating more and more data. Concurrently, networks and network systems are being called on to accommodate and to process more and more data. Disk drive components, once having a form factor of 5.25 inches, have evolved to current industry standards of 3.5 and 2.5 inch form factors. An exemplary three rack unit tray in a computer system rack can therefore house a correspondingly greater number of disk drive components in the available space. Efficient use of the space, while providing for necessary access and airflow, presents continuing challenges to the configuration and arrangement of disk drives, and other component devices within a system rack.

In consideration of the foregoing, what is needed is an efficient method and system of arranging, mounting, and positioning component devices that enables easy access in a minimum of space.

SUMMARY OF THE INVENTION

Broadly speaking, the present invention fills these needs by providing a component carrier and system for providing access to individual components that provides necessary security and airflow, and enables access, connection, and disconnection from single or multiple arrays of components without requiring the connection or disconnection of adjacent or commonly connected components. The present invention can be implemented in numerous ways, including as a process, an apparatus, a system, a device, or a method. Several embodiments of the present invention are described below.

In one embodiment, a component mounting device is provided. The component mounting device includes a component collar, and a component mounting frame configured to receive the component collar. A clocked gear assembly is coupled to the component mounting frame. The clocked gear assembly is configured to enable movement of the component in at least two directions to actively enable the component.

In another embodiment, a component mounting device is provided. The component mounting device includes a component collar for holding a component. The component collar has a first rack gear and a second rack gear. The component mounting device further includes a component mounting frame configured to receive the component collar, and a clocked gear assembly coupled to the component mounting frame. The clocked gear assembly is configured to enable movement of the component collar in a first direction upon initial engagement with the first rack gear of the component mounting frame, and is configured to enable movement of the component collar in a second direction upon release of the clocked gear assembly by first rack gear and engagement of the second rack gear to the clocked gear assembly.

In a further embodiment, a computer component mounting device is provided. The computer component mounting device includes a computer component disposed in a component collar, and a component mounting frame configured to receive the component collar. A clocked gear assembly is provided which is configured to enable movement of the computer component in each of a first direction and a second direction. The computer component mounting device provides for positioning the computer component in the first direction and for positioning the computer component in the second direction.

In still another embodiment, a computer device carrier system is provided. The computer device carrier system includes a carrier blade capable of receiving a plurality of computer devices, and further configured to arrange the plurality of computer devices in at least one array of computer devices. A computer device frame is attached to the carrier blade. The computer device frame provides positioning and support for a computer device, and includes a clocked gear assembly. The clocked gear assembly is capable of positioning the computer device in each of a first direction and a second direction. The computer device carrier system also includes a computer device collar coupled to the computer device. The computer device collar is configured to be received by the computer device frame to position and support the computer device.

In another embodiment, a storage array carrier system in an integrated computer and server component rack is provided. The storage array carrier system includes a carrier blade capable of receiving a plurality of storage devices, and further capable of arranging the plurality of storage devices in a plurality of linear arrays. A storage device frame is attached to the carrier blade to position and to secure a storage device. The storage device frame includes a clocked gear assembly configured to enable movement of the storage device in both a vertical and a horizontal direction. The storage array carrier system also includes a device collar coupled to the storage device. The device collar is capable of being received in a track of the storage device frame. The device collar is configured to mesh with the clocked gear assembly to position the storage device and to connect the storage device to, and to disconnect the storage device from, a power and data connection.

In yet a further embodiment, an apparatus is provided. The apparatus includes a collar, a first gear positioned on the collar, and a second gear positioned on the collar and proximate to the first gear. The first and the second gears are configured for engaging corresponding portions of a receiving mechanism.

The advantages of the present invention over the prior art are numerous, and will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION

An invention for a component device array mechanical layout, and for a component device carrier system is described. Embodiments of the invention include a component device carrier assembly having a collar and clocked gears to provide motion in at least two directions for device insertion and removal in a densely arranged and constrained space. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
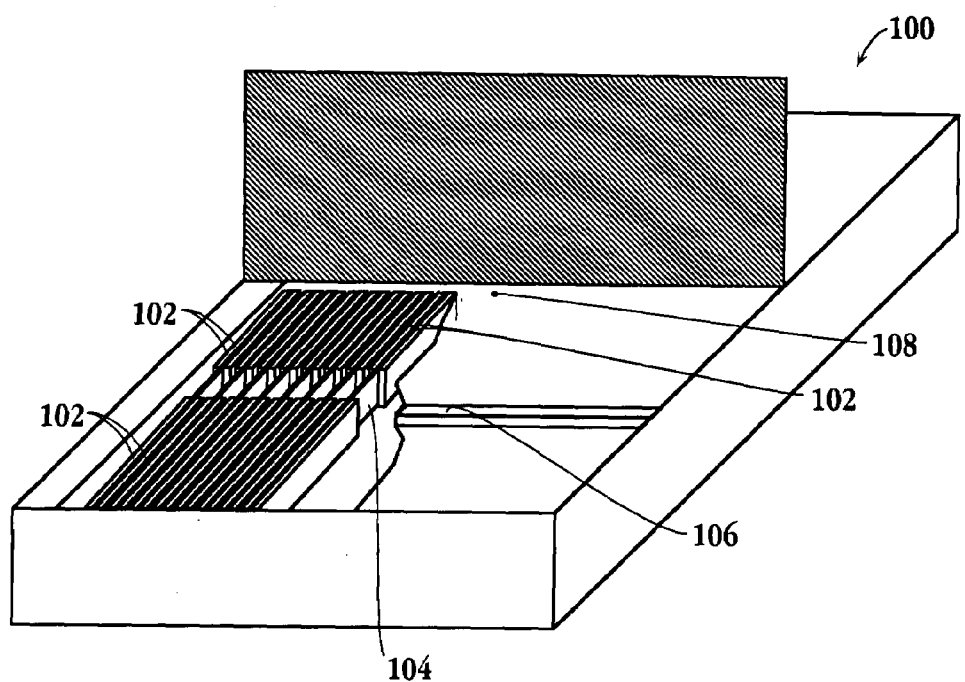
FIG. 1 is a line drawing of a system rack tray in accordance with an embodiment of the invention.

FIG. 1 is a line drawing of a system rack tray 100 in accordance with an embodiment of the invention. System rack tray 100 defines an array chassis in which component devices 102 are attached to network component blades 104 forming densely packed arrays of component devices 102. In one embodiment, each network component blade 104 is capable of receiving four component devices 102 such as disk drives. In the illustrated embodiment, component devices 102 such as disk drives are mounted or positioned with two disk drives on each of the two sides of the vertically oriented (on edge) network component blade 104, for a total of four disk drives on each network component blade 104. It should be appreciated that the illustrated and described configuration is but one implementation of an embodiment of the present invention. The present invention is not limited to implementation on network component blades 104, implementation with disk drives, or implementation with the illustrated four disk drives on each network component blade 104. As is discussed in greater detail below, embodiments of the present invention can be implemented with a wide variety of component configurations and for a plurality of uses.

Continuing the description of FIG. 1, each component device 102 is provided power, data, or any other desired connections to enable insertion and removal of individual component devices 102 from network component blade 104 without requiring an entire network component blade 104, or an entire array of component devices 102 to be enabled or disabled, i.e., to be removed to create space within which to manipulate a desired component device 102. Additionally, each network component blade 104 functions as a PCB providing individual data and power connections for each component device 102 capable of being attached. Embodiments of network component blades 104 are constructed of such materials as FR4, cast zinc (Zn) or magnesium (Mg), sheet metal (e.g., cold rolled steel), and plastics such as ABS and PC.

In one embodiment of the invention, each network component blade 104 is attached to and receives data and power from a mid-plane 106. In one embodiment, each network component blade 104 is attached to and receives data and power from a back-plane 108. As illustrated in FIG. 1, access to a single component device 102 in an interior part of an array, indicated for example at 103, is constrained without sufficient room to obtain necessary leverage or mechanical advantage to withdraw a single component device 102 from the array, or to connect or disconnect a single component device 102 from an electrical, data, or other connection (not shown).

Figure 2A:
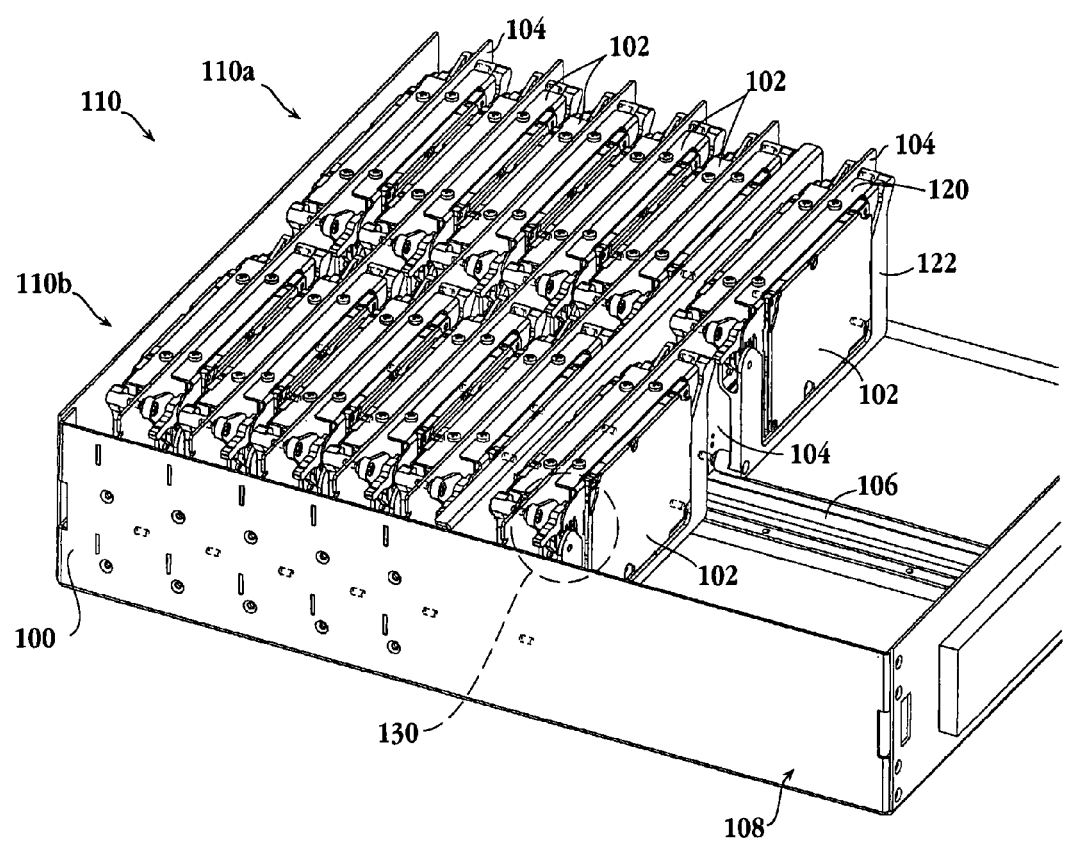
FIG. 2A shows a multi-array of component devices in accordance with an embodiment of the present invention.

FIG. 2A shows a multi-array 110 of component devices 102 in accordance with an embodiment of the present invention. As used herein, a "multi-array" is a configuration of more than one linear array of component devices. A multi-array can include two, three, four, or any other number of linear arrays of component devices in a single location such as a system rack tray 100. A plurality of network component blades 104 are shown arranged on edge such that each network component blade 104 having a length and a height, with the length typically being greater than the height, and the length being oriented parallel to the floor of the system rack tray 100 with a plane of the component device oriented essentially orthogonal to the plane of the floor of the system rack tray 100. Each network component blade 104 with two component devices 102 connected to each of two sides of the network component blade 104, forms a plurality of arrays, e.g., 110a and 110b, of component devices 102 within a system rack tray 100. In one embodiment, each network component blade 104 receives power and data connection along mid-plane 106. In one embodiment, each network component blade 104 receives power and data connection along back-plane 108. Each network component blade 104 provides for individual power, data, or any other desired connection to each of the component devices 102 mounted thereon.

In one embodiment of the present invention, the component devices 102 are disk drives, and are connected to network component blades 104 with an inventive component device carrier assembly, described in greater detail below in reference to FIGS. 3A-3C. As shown in FIG. 2A, a component device carrier assembly includes component device collar 120, which in FIG. 2A is attached to component device 102, e.g., a disk drive, and a component device frame 122 attached to network component blade 104. A clocked gear assembly 130, described in greater detail below in reference to FIGS. 4A-4C, enables movement of disk drive (component device) 102 in at least two directions to enable insertion or removal of component device 102 from within multi-array 110 as well as connection and disconnection from power, data, or any other connection.

Figure 2B:
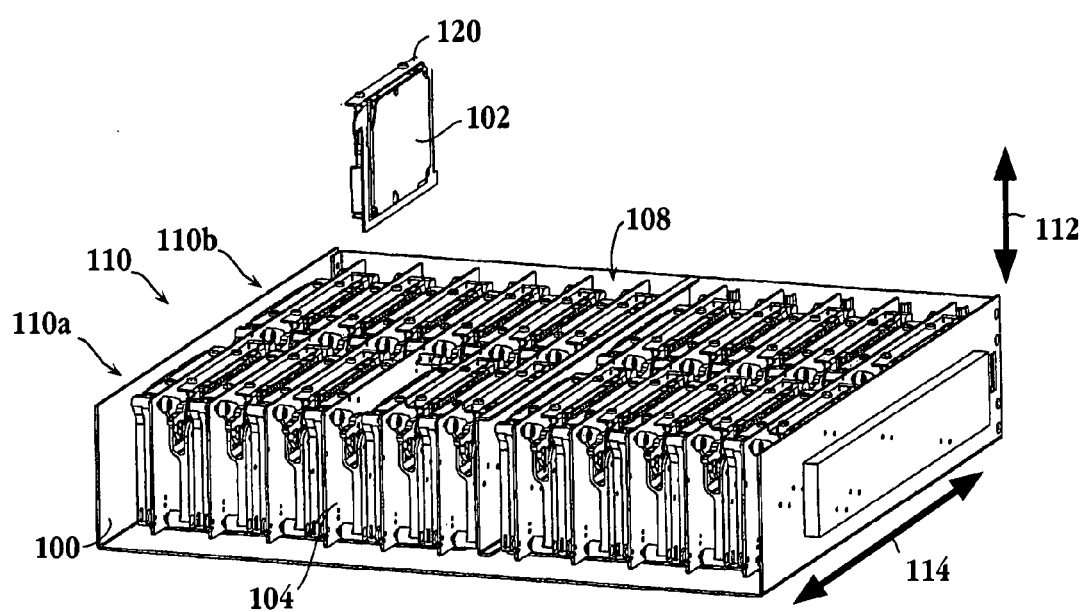
FIG. 2B shows the multi-array of component devices of FIG. 2A with a single component device withdrawn from the multi-array in accordance with one embodiment of the invention.

FIG. 2B shows the multi-array 110 of component devices 102 of FIG. 2A with a single component device 102 withdrawn from the multi-array 110 in accordance with one embodiment of the invention. In one embodiment of the invention, each component device 102 is individually removable from a multi-array 110 of component devices 102, without requiring an entire network component blade 104 to be removed, and without requiring additional component devices to be removed and taken off line to create space for obtaining sufficient leverage to manipulate individual component devices 102. Each component device 102 attached to a network component blade 104 is individually removable, thereby taking only a single device off line as desired.

Embodiments of the present invention provide security of mounting and attachment of component devices 102 in multi-arrays 110 within a system rack tray 100 by use of securely attached network component blades 104, as well as a component device carrier assembly to attach each component device 102, such as a disk drive, to network component blades 104. Component device carrier assembly includes component device collar 120 attached to component device 102, and a component device frame 122 attached to network component blade 104. A clocked gear assembly 130 enables the movement of component device 102 in at least two directions. Such movement enabled by the clocked gear assembly 130 can include, for example, vertical movement (with reference to the orientation shown in FIG. 2B) into or out of an array 110a, 110b, of component devices 102, as well as horizontal movement to connect or disconnect from power, data, or any other appropriate connection on a network component blade 104.

As can be appreciated from FIG. 2B, embodiments of the present invention enable insertion and removal of a single component device 102, whether in a front array 110a or a rear array 110b, or some other array, by providing for motion into or out of the array 110a, 110b, e.g., from above and indicated by arrow 112, as well as motion into or out of a power, data, or other connection on network component blade 104, in a direction indicated by arrow 114. In the densely packed system rack tray 100 shown in FIG. 2B, embodiments of the present invention provide the necessary mechanical advantage to manipulate a single component device 102 without impacting adjacent or additional component devices 102.

Figure 2C:
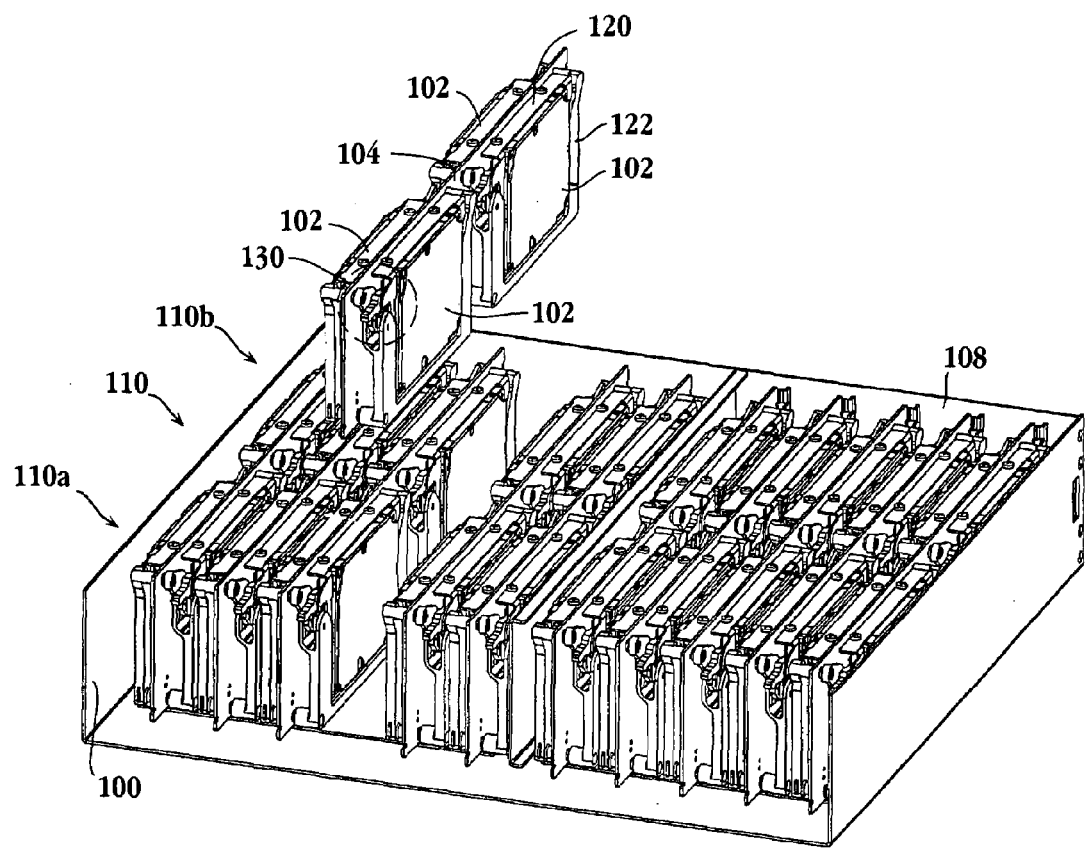
FIG. 2C shows the multi-array of component devices of FIG. 2A with a single network component blade withdrawn from the multi-array in accordance with one embodiment of the invention.

It should be further appreciated that, while embodiments of the present invention enable access to and manipulation of single component devices 102, it may also be desirable to access an entire network component blade 104. Embodiments of the present invention further provide for insertion or removal of an entire network component blade 104 having a plurality of component devices 102 configured thereto. FIG. 2C shows the multi-array 110 of component devices 102 of FIG. 2A with a single network component blade 104 withdrawn from the multi-array 110 in accordance with one embodiment of the invention.

Figure 3A:
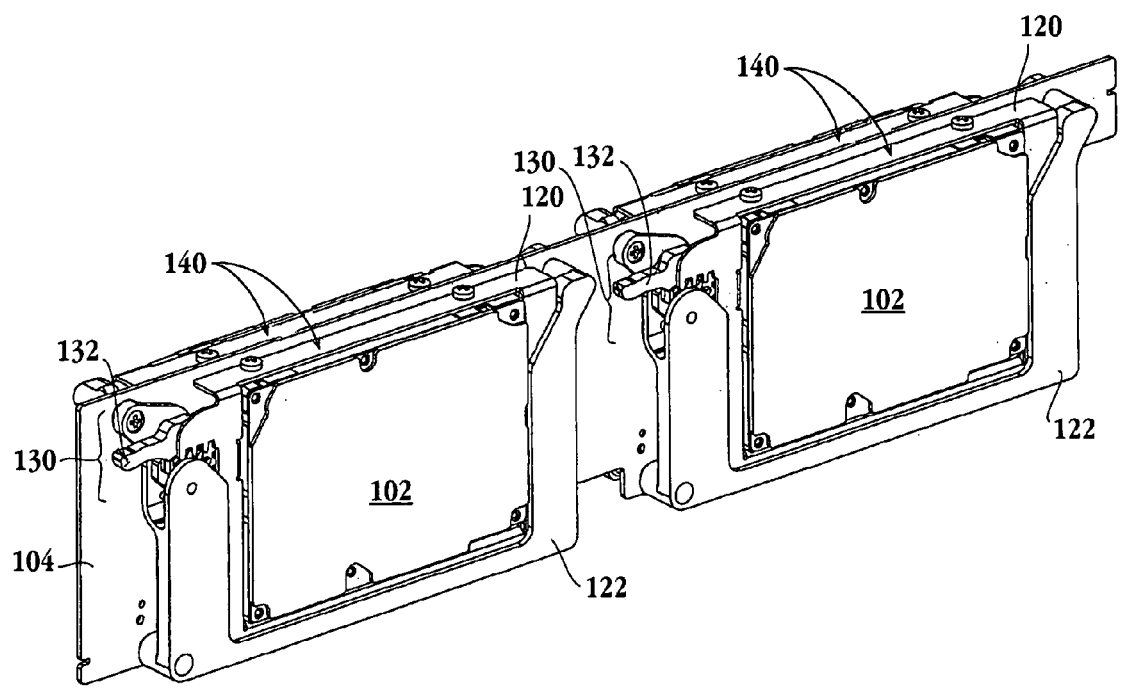
FIG. 3A shows a network component blade having a plurality of component devices configured thereto, in accordance with one embodiment of the present invention.

FIG. 3A shows a network component blade 104 with a plurality of component devices 102, in accordance with one embodiment of the present invention. In other embodiments, component device carrier assemblies 140 are implemented with or without network component blades 104, and network component blades 104 may have more or less component devices 102 than the illustrated embodiment. As illustrated in FIG. 3A, each component device 102 is configured to the network component blade 104 with a component device carrier assembly 140 in accordance with one embodiment of the present invention. Each illustrated component device carrier assembly 140 is implemented with a component device 102, and includes a component device collar 120, frame 122, clocked gear assembly 130, and power and data connector 152 (see FIG. 3C).

In one embodiment of the present invention, component device carrier assembly 140 enables the connection and disconnection of a component device, e.g., a disk drive, from within an array or multi-array of component devices without requiring any adjacent component device to be disabled or disconnected to gain access. In one embodiment of the invention, component device carrier assembly 140 provides for movement of a component device 102 such as a disk drive in each of at least two directions of motion. By way of example, movement in a vertical direction allows for a component device to be inserted into or removed from an array or multi-array of component devices, typically from above, or by way of access from a position over a point of connection, without requiring adjacent component devices to be disconnected. Movement in a horizontal direction allows for a component device to be connected or disconnected from a power and data connection, without requiring adjacent component devices to be disconnected. It should be understood that the terms "vertical" and "horizontal" as used herein are in reference to an orientation of embodiments of the present invention as illustrated in FIG. 3A, as well as in FIG. 2B including directional arrow 112 representing a vertical direction and arrow 114 representing a horizontal direction.

Figure 3B:
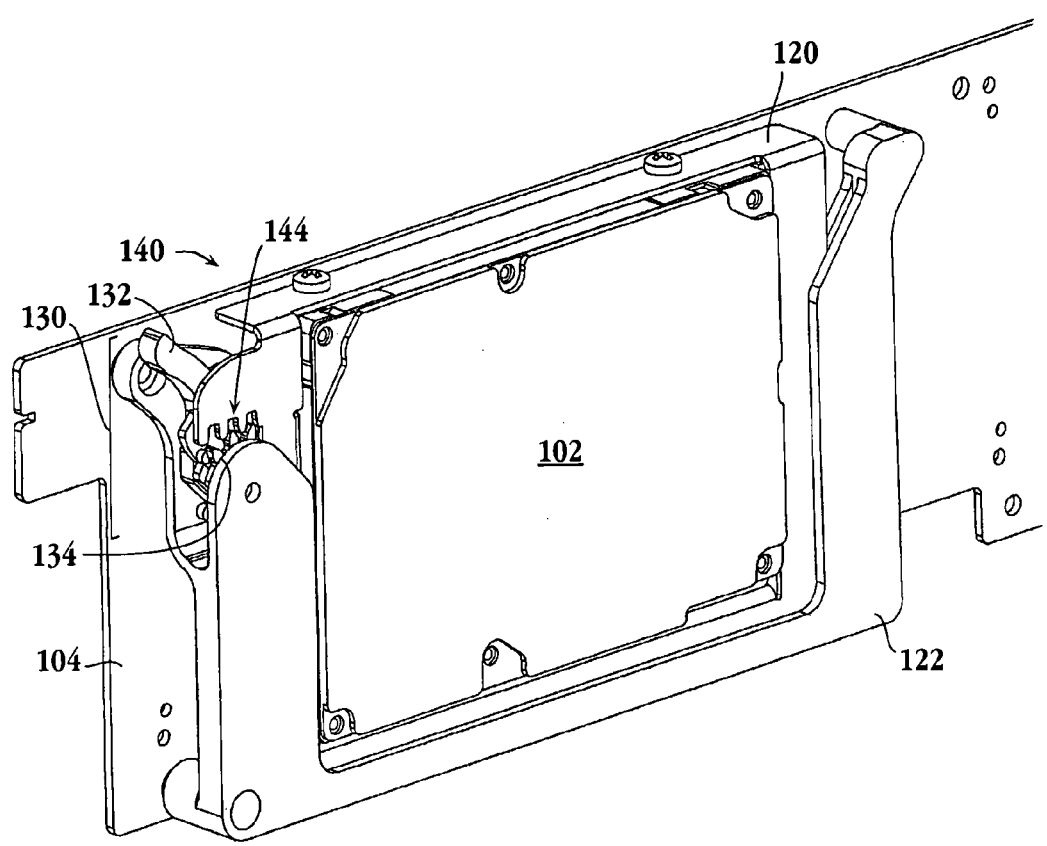
FIG. 3B shows a single component device carrier assembly in accordance with one embodiment of the present invention.

FIG. 3B shows a single component device carrier assembly 140 in accordance with one embodiment of the present invention. Component device carrier assembly 140 is illustrated as implemented with a component device 102, and including component device collar 120, frame 122, clocked gear assembly 130, and power and data connector 152. In one embodiment of the invention, frame 122 and power and data connection 152 (see FIG. 3C) are attached to network component blade 104, clocked gear assembly 130 is attached to frame 122, and component device collar 120 is attached to a component device 102.

Figure 3C:
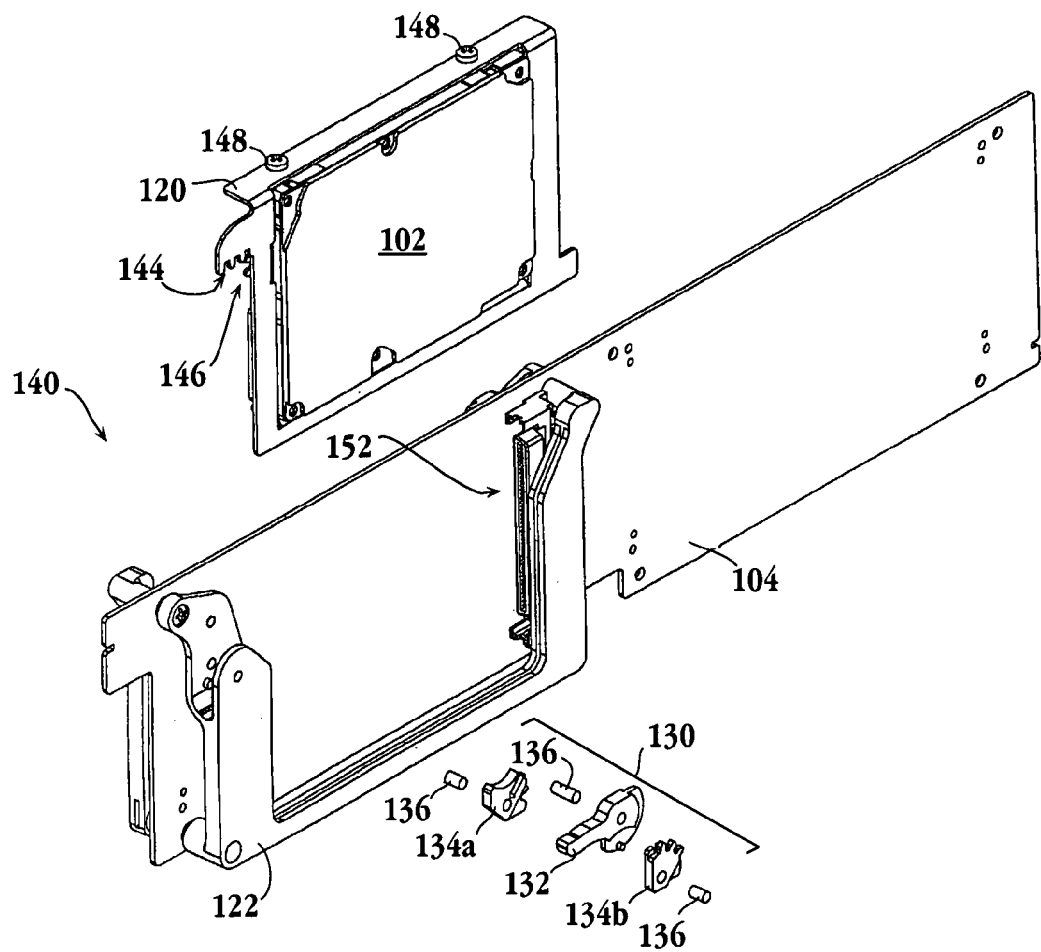
FIG. 3C shows an exploded view of a component device carrier assembly, in accordance with one embodiment of the present invention.

FIG. 3C shows and exploded view of a component device carrier assembly 140, in accordance with one embodiment of the present invention. As illustrated in FIG. 3C, a power and data connector 152, also known as a board connector 152, is attached to network component blade 104. As is known, connection to and disconnection from a power and data connector 152 requires some amount of force in at least one direction of motion. In one arrangement of component devices, one direction of motion is essentially perpendicular to a direction of motion in which some amount of force is required for insertion or removal of a component device within a multi-array of component devices (see, e.g., FIG. 2B). As described in greater detail below in reference to FIGS. 4A-4C, movement in at least two directions of motion is achieved with essentially a single movement of lever 132, and resulting action of clocked gear assembly 130.

As shown in FIG. 3C, component device collar 120, which in one embodiment is a disk drive collar, attaches to a component device such as a disk drive with device fasteners 148. In other embodiments, component device collar 120 attaches with clamps, pins, adhesive, bonding, or any other manner of temporarily or permanently attaching the component device collar 120 to a component device. Component device collar 120 may be constructed of any suitable material providing sufficient support and structure for movement of component device, is light in weight, and easily manufactured. Representative materials include sheet metal such as cold rolled steel.

Component device collar 120 includes horizontal rack gear 144 and vertical rack gear 146. Horizontal rack gear 144 and vertical rack gear 146 engage with clocked gears 134a and 134b of the clocked gear assembly 130 to effect the movement of the component device in at least two directions, e.g., vertical and horizontal movement when the component device carrier assembly 140 is orientated as illustrated in FIG. 3C. Such vertical and horizontal movement can be further described as co-planer, in one embodiment, as discussed below in reference to FIGS. 5C and 5D. Clocked gear assembly 130 includes a vertical clocked gear 134a, lever 132, and a horizontal clocked gear 134b, joined by pins 136.

Figure 5A:
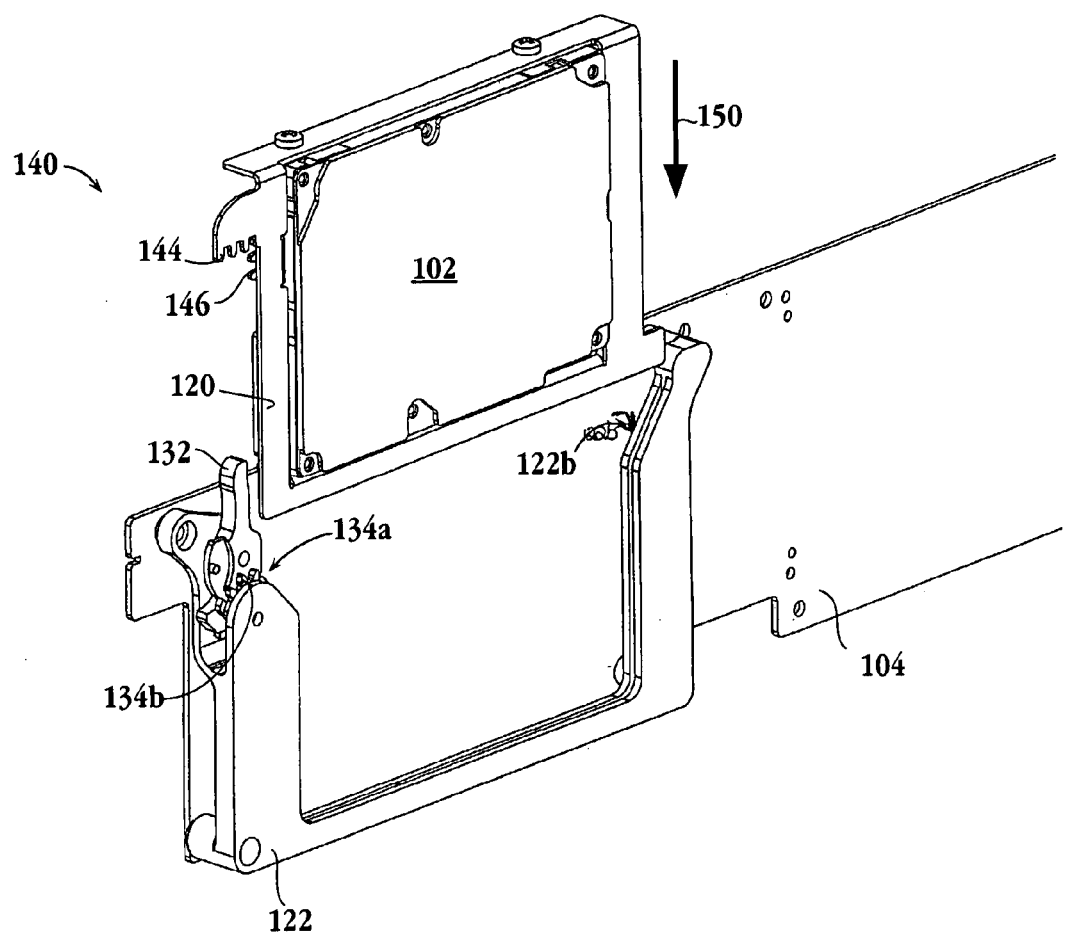
FIG. 5A shows a component device carrier assembly having a component device disposed within a component device collar, and positioned over frame prior to ion.

In one embodiment of the invention, component device collar 120 is attached to a component device such as a disk drive, with device fasteners 148. In order to configure a component device to network component blade 104, and to connect to power and data connector 152, component device collar 120 is vertically (on edge, e.g. see FIG. 3B) inserted into frame 122. Lever 132, of clocked gear assembly 130, is in a first position, which in one embodiment is with the distal end of lever 132 pointed essentially upwards, as shown in FIG. 5A below. Insertion into an array or multi-array requires little, if any, assist as gravity essentially provides the necessary force to effect the motion in a first direction to seat the component device collar 120 in frame 122, when the component device carrier assembly 140 is oriented as illustrated in FIG. 3C. As component device collar 120 is inserted, e.g., lowered in the illustrated embodiment, into frame 122, vertical rack gear 146 on component device collar 120 engages vertical clocked gear 134a. As the engaged gears 146 and 134a mesh, distal end of lever 132 rotates from the essentially upright, or essentially pointing upwards, position, to approximately 45 degrees off of vertical as component device collar 120 seats in frame 122. To illustrate, if when the distal end of lever 132 points essentially upwards (see FIGS. 5A and 5B), it may be described as pointing to 12 o'clock, or to 000 degrees. Upon insertion of component device collar into frame 122, distal end of lever 132 rotates counter-clockwise (referenced from the illustrated perspective) from the 12 o'clock position to approximately the 10:30 o'clock position, or from 000 degrees to approximately 315 degrees.

As the component device collar 120 reaches the extent of vertical or downward travel and seats in frame 122, horizontal rack gear 144 engages with horizontal clocked gear 134b. Simultaneously, drive to vertical clocked gear 134a is disengaged as drive to horizontal clocked gear 134b is engaged so that continued movement of lever 132 beyond 45 degrees (e.g., beyond the position of 10:30 o'clock or 315 degrees) actuates horizontal clocked gear 134b. In one embodiment, the point at which drive to vertical clocked gear 134a is disengaged and drive to horizontal clocked gear 134b is engaged defines the cross-over point, illustrated in FIG. 5C.

In one embodiment, movement of lever 132 continues from about 45 degrees to about 90 degrees off of or relative to vertical. This continued movement may be further described as movement in a counter-clockwise direction (referenced from the illustrated perspective) from the position of about 10:30 o'clock to about 9 o'clock or from about 315 degrees to about 270 degrees Horizontal clocked gear 134b, engaged with horizontal rack gear 144, provides necessary motion in a second direction to seat power and data connector (not shown) on component device 102 with power and data connector 152 mounted on component blade 104. The continued movement or positioning of lever 132 provides the necessary movement in the second direction to seat component device into power and data connector 152. The second direction should be understood to be essentially perpendicular to the first direction. Assuming a typical full circle of 360 degrees, movement of lever 132 through just approximately 90 degrees effects positioning and seating of component device 102 (disposed within component device collar 120) including movement of component device collar 120 in at least two directions.

In one embodiment of the invention, reversal of the above described steps is followed to accomplish removal or extraction of a component device. Lever 132 is rotated in a clockwise direction from about 90 degrees off vertical to about 45 degrees off vertical (also described as from about 9 o'clock to about 10:30 o'clock, or from about 270 degrees to about 315 degrees), during which horizontal clocked gear 134b is actuated. Horizontal clocked gear 134b, engaged with horizontal rack gear 144, provides sufficient force to effect movement of component device in the second direction of motion to disengage power and data connection on component device from power and data connector 152. At about 45 degrees (also 10:30 o'clock or 315 degrees), lever 132 disengages from horizontal clocked gear 134b. Simultaneously, lever 132 engages vertical clocked gear 134a which engages with vertical rack gear 146 to provide force effecting movement of the component device in the first direction of motion, unseating component device collar 120 from frame 122, and raising component device above a top level of the array or multi-array of component devices from which the component device is being removed. At the extent of travel in the first direction of motion, distal end of lever 132 once again points essentially upwards (e.g., towards 12 o'clock, or 000 degrees). The component device can be thereby extracted without requiring disconnection of one or more adjacent component devices, or arrays of component devices.

It should be appreciated that the movement in a first and a second direction illustrated above as "vertical" and "horizontal" is exemplary and not exclusive or limiting. In other embodiments of the present invention, component device carrier assembly 140 can be oriented in any manner desired, and therefore references to "vertical" and "horizontal" may be misleading or inaccurate. The first and second directions, in one embodiment, are substantially co-planar, and effect movement into a frame receptacle, and then within the frame receptacle, effect movement in an essentially perpendicular direction to the first direction. Another description of the movement is "in" and "over." The co-planar quality can be illustrated with the component device 102 disposed within component device collar 120. The plane defined by the face of the component device 102 (e.g., the visible surface of component device 102 as illustrated in FIG. 3C), further defines the plane within which movement in a first direction and movement in a second direction takes place. When the component device 102 (disposed within component device collar 120) is moved in a first direction and then in a second direction, all of the movement is within the plane defined by the face of the component device 102, and therefore the movement in the first direction and the movement in the second direction is said to be co-planar.

In one embodiment of the invention, component device collar 120 is provided. Component device collar 120 includes the horizontal rack gear 144, also known as a first gear which is positioned on the component device collar 120. Component device collar ruther includes a vertical rack gear 146, also known as a second gear which is also positioned on the component device collar 120, and as illustrated in FIG. 3C, is proximate to the horizontal rack gear 144, or first gear. Horizontal rack gear 144 and vertical rack gear 146 are configured to engage with corresponding gears in a receiving assembly, identified as the clocked gears 134a and 134b of frame 122. Each of the horizontal rack gear 144 and the vertical rack gear 146, i.e., the first gear and the second gear, is formed of a plurality of linearly arranged teeth, with the horizontal rack gear 144 and the vertical rack gear 146 oriented substantially perpendicular to each other, and each of the horizontal rack gear 144 and the vertical rack gear 146 includes a same number of linearly arranged teeth. As described above, the horizontal rack gear 144, also first gear, defines a first plane of movement of the device collar 120, and the vertical rack gear 146, also second gear, defines a second plane of movement of the device collar 120.

Figure 4A:
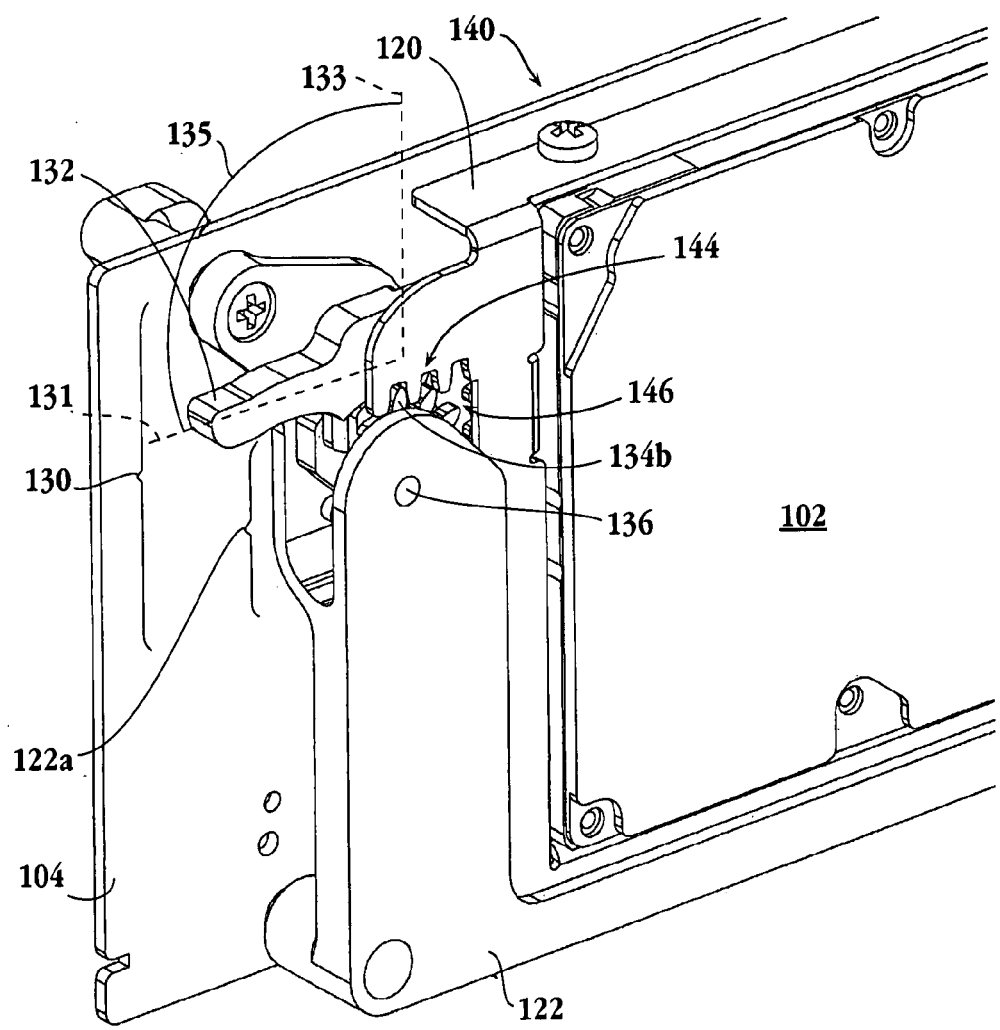
FIG. 4A shows a detail view of component device carrier assembly and clocked gear assembly in accordance with one embodiment of the present invention.

FIG. 4A shows a detail view of component device carrier assembly 140 and clocked gear assembly 130 in accordance with one embodiment of the present invention. As shown in FIG. 4A, component device 102 is disposed within component device collar 120 which is seated in frame 122. Distal end of lever 132 is shown in a 90 degree (off vertical) position (also 9 o'clock and 270 degrees), indicating extent of motion in a second direction. In other words, the component device has been moved in a first direction of motion and in a second direction of motion and is seated and connected. Vertical clocked gear 134a (see FIG. 4B) is hidden from view in FIG. 4A, and would have meshed with vertical rack gear 146 during movement in the first direction of motion. Horizontal clocked gear 134b has meshed with horizontal rack gear 144 to effect movement in the second direction of motion.

In one embodiment of the invention, lever 132 is moved in a single motion between positions indicated at 131 and 133, along arc 135. As described above, travel of lever 132 is through approximately 90 degrees, with reference to a 360 degree circle. At a position approximately one half way through the 90 degrees of travel, e.g., at approximately 45 degrees of travel, one of vertical clocked gear 134a and horizontal clocked gear 134b disengages from drive and the other of vertical clocked gear 134a and horizontal clocked gear 134b engages. When one of vertical clocked gear 134a and horizontal clocked gear 134b disengages and the other engages, movement of the component device, disposed in component device collar, changes from movement in one of the first or second direction to movement in the other direction, and is also known as the cross-over point.

Figure 4B:
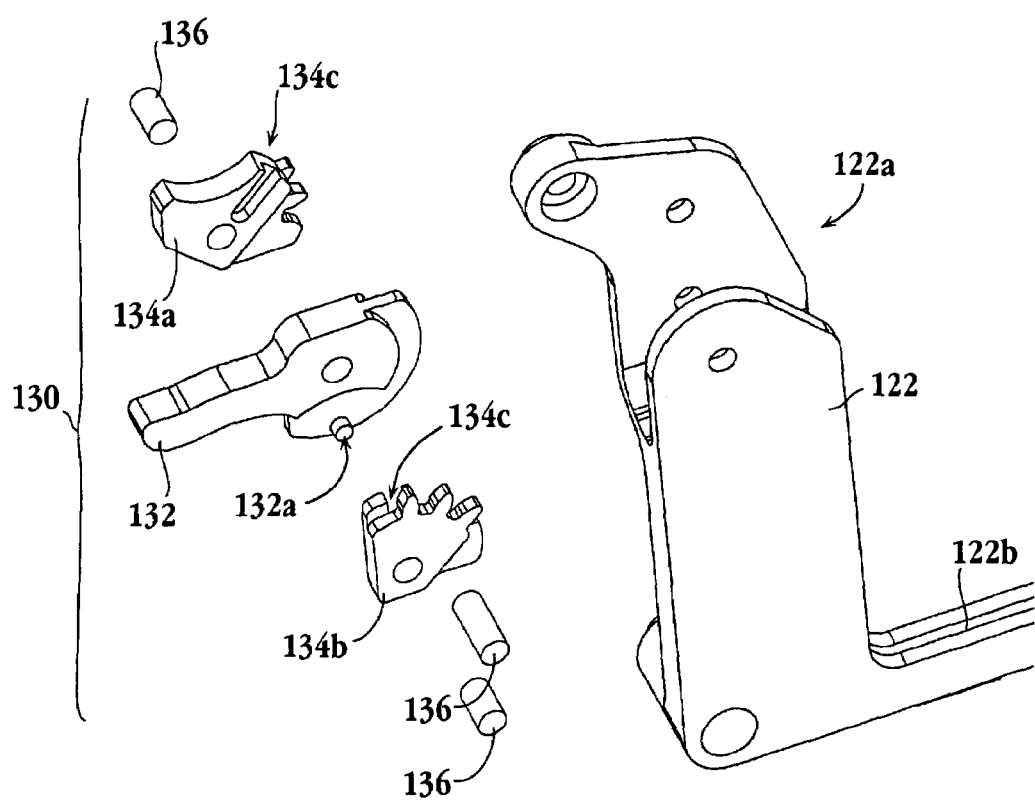
FIG. 4B shows an exploded view of clocked gear assembly in accordance with one embodiment of the present invention.

FIG. 4B shows an exploded view of clocked gear assembly 130 in accordance with one embodiment of the present invention. In one embodiment of the invention, lever 132 includes two gear pins 132a, one of which is visible in FIG. 4B, and one of which is hidden on a back side of lever 132. Gear pins 132a are configured to engage gear slots 134c. Each of vertical clocked gear 134a and horizontal clocked gear 134b has a gear slot 134c. In one embodiment, one of gear pins 132a engages gear slot 134c in vertical clocked gear 134a when accomplishing movement of component device in a first direction of motion, and then the other of gear pins 132a engages gear slot 134c in horizontal clocked gear 134b when accomplishing movement of component device in a second direction of motion. When lever 132 is at the cross-over point, also described as being in the cross-over position, at about 45 degrees of travel as described above, one gear pin 132a exits gear slot 134c in one of vertical clocked gear 134a and horizontal clocked gear 134b. Simultaneously, the other gear pin 132a engages the other of vertical clocked gear 134a and horizontal clocked gear 134b. In this manner, clocked gear assembly 130 effects a change in applied movement from a first direction to a second direction, as well as from the second direction to the first direction in accordance with movement of lever 132. Exemplary materials from which lever 132, clocked gears 134, and gear pins 132a are constructed include molded plastics such as PC and ABS, as well as cast Zn or Mg.

In one embodiment of the invention, frame 122 includes yoke 122a in which clocked gear assembly 130 is positioned. Vertical clocked gear 134a and horizontal clocked gear 134b are thereby positioned essentially along an interior of frame 122. When component device collar 120 (see FIG. 4A) within which component device is disposed is inserted into frame 122, edge of component device collar 120 is guided by and seats into track 122b of frame 122.

Figure 4C:
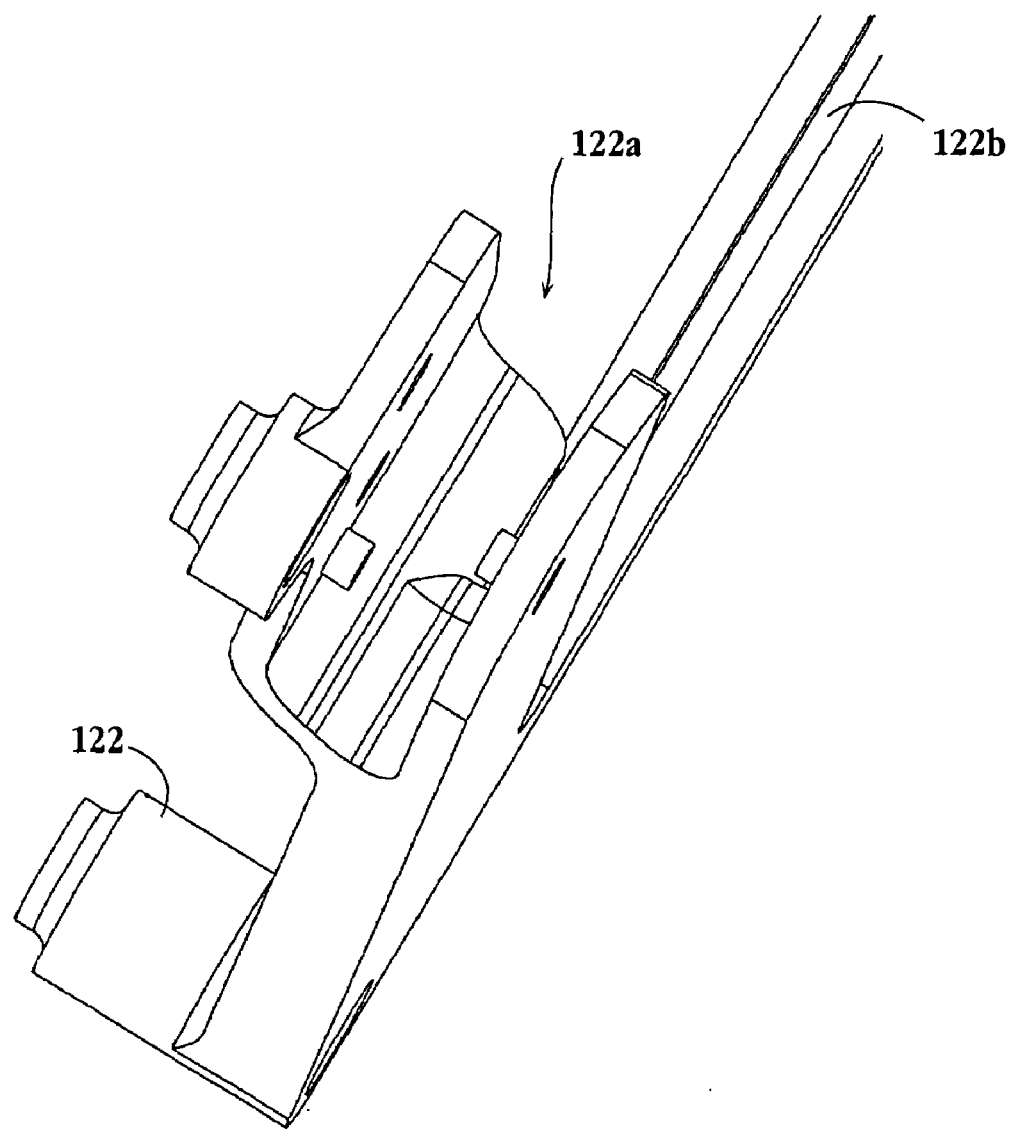
FIG. 4C shows a top detail view of yoke in frame in accordance with one embodiment of the invention.

FIG. 4C shows a top detail view of yoke 122a in frame 122 in accordance with one embodiment of the invention. In one embodiment, yoke 122a is configured to receive clocked gear assembly 130 (see FIG. 4B). As described above, clocked gear assembly 130 provides for movement of a component device in at least two directions. Component device collar 120 (see FIG. 4A) is disposed around a component device 102, and is configured to be received in track 122b of frame 122. In one embodiment, when inserting a component device, an extent of the movement in the first direction required to insert the component device is reached when the component device collar 120 seats in track 122b of frame 122. During motion in the second direction, component device collar 120 is guided along track 122b in which it is seated until connection is established with data and power connector 152 (see FIG. 3C).

FIGS. 5A-5D illustrate insertion of a device component 102 using a component device carrier assembly 140 in accordance with one embodiment of the present invention. FIG. 5A shows a component device carrier assembly 140 having a component device 102 disposed within a component device collar 120, and positioned over frame 122 prior to installation. During installation, component device collar 120 is received in track 122b of frame 122 as component device 102 is first lowered 150 into position. By way of example, the illustrated component device carrier assembly 140 might be located in an interior portion of an array of component devices. In such an example, access may only be available from above the position for the component device, and therefore installation of a component device requires that it be lowered 150 into position from which it can be secured in place and connected to power and data.

In FIG. 5A, features of the component device carrier assembly 140 are identified for reference purposes, and include horizontal rack gear 144 and vertical rack gear 146 on frame 120. Horizontal clocked gear is shown at 134b, and vertical clocked gear is identified by 134a, although hidden from view behind lever 132. Component device carrier assembly 140 is configured to network component blade 104.

Figure 5B:
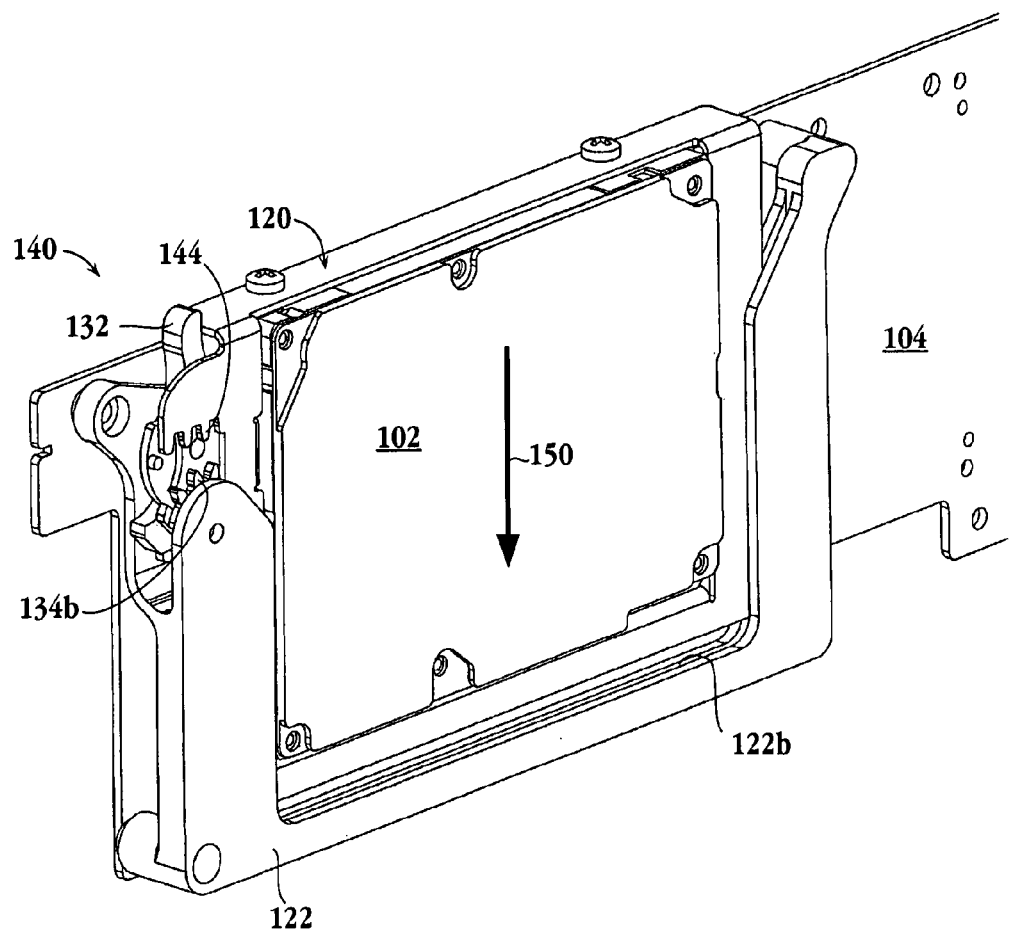
FIG. 5B shows component device disposed within component device collar, and positioned over frame during installation.

FIG. 5B shows component device 102 disposed within component device collar 120, and positioned over frame 122 during installation. Component device collar 120 has been received in track 122b of frame 122, and is shown at approximately a position in which vertical rack gear 146 (see FIG. 5A) engages vertical clocked gear 134a (see FIG. 4B). In other words, FIG. 5B shows component device 102, disposed in component device collar 120, approximately just at engagement of device carrier assembly 140. Lever 132 is essentially upright or vertical, just prior to movement to insert component device as illustrated in the following two figures.

Figure 5C:
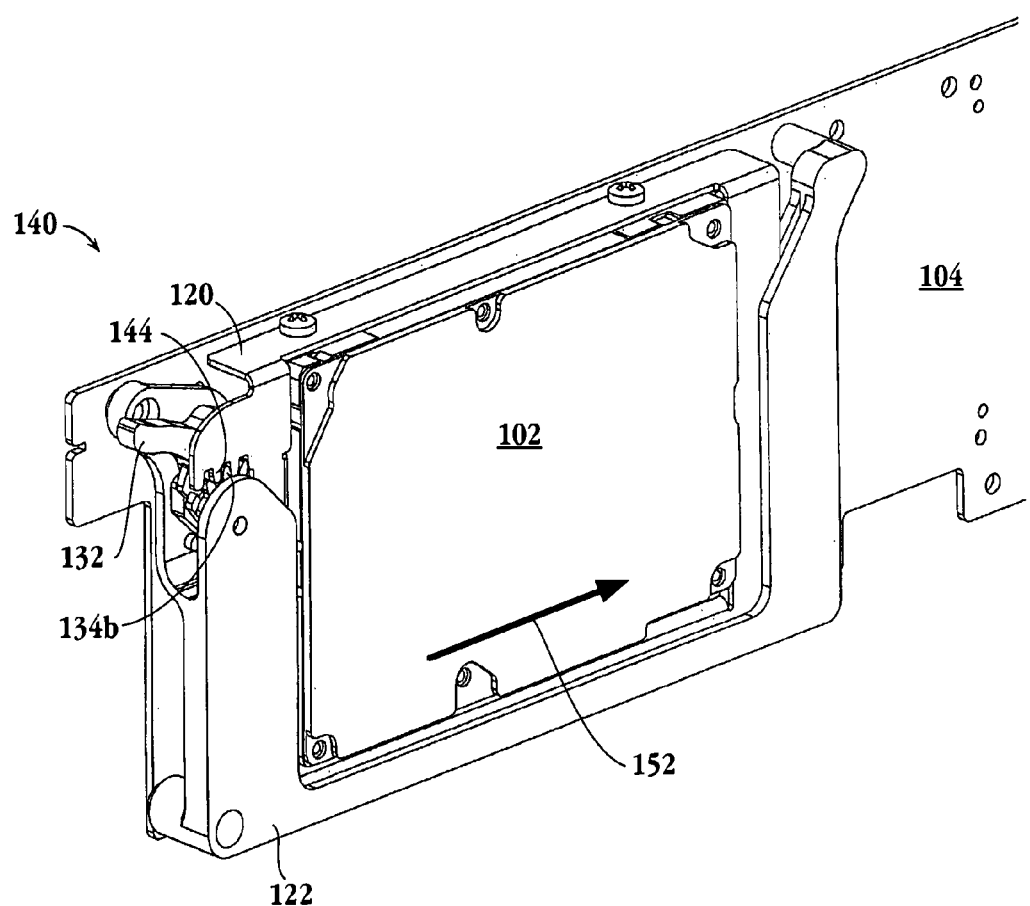
FIG. 5C shows component device disposed within component device collar, and component device collar seated in frame at the extent of downward movement.

FIG. 5C shows component device 102 disposed within component device collar 120, and component device collar 120 seated in frame 122 at the extent of downward movement 150 (see FIG. 5B). FIG. 5C essentially shows the cross-over point in which downward movement 150 is completed, and lateral movement 152, or movement in the second direction, will commence to secure the component device 102, disposed within component device collar 120, in position and connected to power, data, and any other desired connection as described above. Lever 132 has moved in a clockwise direction from the vertical or upright position shown in FIG. 5B, to a position approximately 45 degrees off vertical (approximately 10:30 o'clock, or 315 degrees). At the illustrated position, actuation of vertical clocked gear 134a (see FIG. 4B) is disengaging, and actuation of horizontal clocked gear 134b is engaging, as described above. Horizontal rack gear 144 has meshed with horizontal clocked gear 134b, and continued counterclockwise movement of lever 132 will effect lateral movement 152 to seat and to connect component device 102 disposed within a component device collar 120.

Figure 5D:
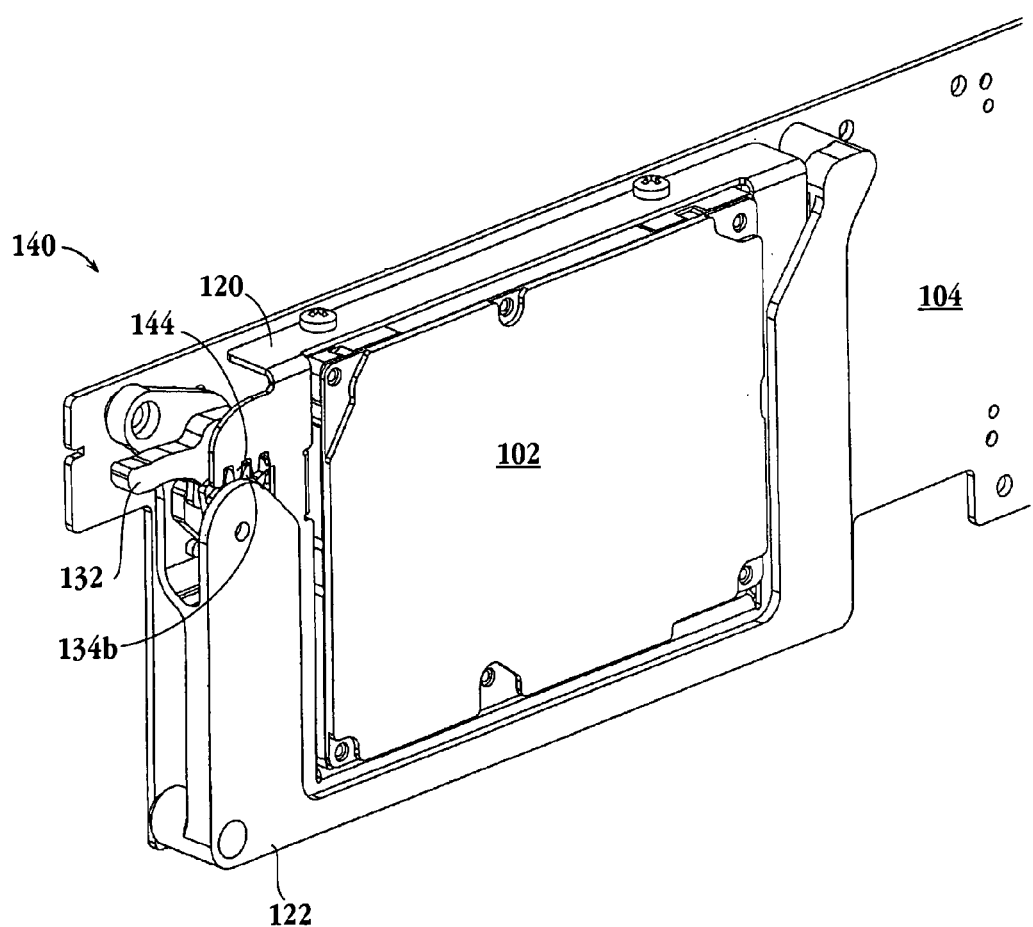
FIG. 5D shows a seated and connected component device in accordance with one embodiment of the invention.

FIG. 5D shows a seated and connected component device in accordance with one embodiment of the invention. Lever 132 has been moved in a counterclockwise direction from the position shown in FIG. 5C, to the illustrated position at 90 degrees off vertical (also 9 o'clock or 270 degrees). The movement of lever 132 effected lateral movement of component device 102 disposed within a component device collar 120, resulting in final positioning and connecting of component device 102.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A component mounting device, comprising:
   a component collar;
   a vertical rack gear on the component collar;
   a horizontal rack gear on the component collar;
   a component mounting frame designed to receive the component collar;
   a clocked gear assembly coupled to the component mounting frame;
   a vertical clocked gear in the clocked gear assembly; and
   a horizontal clocked gear in the clocked gear assembly, wherein the vertical clocked gear is designed to engage the vertical rack gear and the horizontal clocked gear is designed to engage the horizontal rack gear to enable movement of the component collar in at least two substantially perpendicular directions to actively enable the component.

2. The component mounting device of claim 1, further comprising:
   a lever for controlling the vertical clocked gear and the horizontal clocked gear,
   wherein the vertical rack gear meshes with the vertical clocked gear to enable movement of the component collar in a first direction and the horizontal rack gear meshes with the horizontal clocked gear to enable movement of the component collar in a second direction, the first direction and the second direction being substantially perpendicular.

3. The component mounting device of claim 2, wherein movement in the first direction and in the second direction is accomplished by movement of the lever along an arc.

4. The component mounting device of claim 3, wherein the lever includes a first pin to engage the vertical clocked gear, the vertical clocked gear having a first slot for receiving the first pin, and the lever includes a second pin to engage the horizontal clocked gear, the horizontal clocked gear having a second slot for receiving the second pin.

5. The component mounting device of claim 4, wherein movement of the lever through a first segment of the arc causes the first pin to engage the first slot to move the vertical clocked gear and movement of the lever through a second segment of the arc causes the second pin to engage the second slot to move the horizontal clocked gear.

6. The component mounting device of claim 5, wherein the first pin disengages from the first slot and the second pin engages the second slot at a cross-over point.

7. The component mounting device of claim 5, wherein the arc is defined by approximately 90 degrees, the first segment being defined by approximately 45 degrees and the second segment being defined by approximately 45 degrees.

8. The component mounting device of claim 1, wherein movement of the component in a first direction is configured to enable insertion of the component device into an array of component devices and movement of the component in a second direction is configured to enable connection of the component to a board connector.

9. A component mounting device, comprising:
   a component collar for holding a component, the component collar having a first rack gear and a second rack gear;
   a component mounting frame designed to receive the component collar; and
   a clocked gear assembly coupled to the component mounting frame, the clocked gear assembly having a first clocked gear and a second clocked gear, the first clocked gear designed to effect enable movement of the component collar in a first direction upon initial engagement with the first rack gear of the component mounting frame, and the second clocked gear designed to effect movement of the component collar in a second direction upon release of the first clocked gear by first rack gear and engagement of the second rack gear to the second clocked gear.

10. The component mounting device of claim 9, wherein the component mounting frame comprises a track for engaging the component collar, the track guiding the component collar during movement of the component collar in the first direction and guiding the component collar during movement of the component collar in the second direction.

11. The component mounting device of claim 9, wherein movement of the component collar in the second direction is configured to enable connection of the component to a board connector.

12. The component mounting device of claim 9, wherein the clocked gear assembly is further configured to effect movement of the component collar in the first direction upon release of the second clocked gear by the second rack gear of the component mounting frame, and engagement of the first rack gear to the first clocked gear.

13. The component mounting device of claim 12, wherein movement of the component collar in the first direction is configured to enable insertion of the component into an array of components and is further configured to enable extraction of the component from an array of components.

14. A computer component mounting device, comprising:
a computer component disposed in a component collar, the component collar having a vertical rack gear and a horizontal rack gear;
a component mounting frame designed to receive the component collar; and
a clocked gear assembly having a vertical clocked gear and a horizontal clocked gear, the vertical rack gear meshed with the vertical clocked gear to effect movement of the computer component in a first direction and the horizontal rack gear meshes with the horizontal clocked gear to effect movement of the component in a second direction, wherein the computer component mounting device provides for positioning the computer component in the first direction and in the second direction, and the second direction is substantially perpendicular to the first direction.

15. The computer component mounting device of claim 14, wherein the clocked gear assembly includes:
a lever for controlling the vertical clocked gear and the horizontal clocked gear,
wherein the vertical clocked gear and the horizontal clocked gear are independently actuated by movement of the lever, the lever having a first pin configured to engage a first slot on the vertical clocked gear and the lever further having a second pin configured to engage a second slot on the horizontal clocked gear.

16. The computer component mounting device of claim 15, wherein positioning the computer component in the first direction and in the second direction is accomplished by movement of the lever in through a single arc.

17. The computer component mounting device of claim 15, wherein movement of the lever through a first arc segment causes the first pin to engage the first slot to move the vertical clocked gear, and movement of the lever through a second arc segment causes the second pin to engage the second slot to move the horizontal clocked gear.

18. A computer device carrier system, comprising:
a carrier blade capable of receiving a plurality of computer devices and further configured to arrange the plurality of computer devices in at least one array of computer devices;
a computer device collar coupled to a computer device, the computer device collar having a vertical rack gear and a horizontal rack gear; and
a computer device frame attached to the carrier blade, the computer device frame providing positioning and support for the computer device, and including a clocked gear assembly having a vertical clocked gear and a horizontal clocked gear capable of positioning the computer device in a first direction upon engagement of the vertical clocked gear with the vertical rack gear and positioning the computer device in a second direction upon release of the engagement of the vertical clocked gear with the vertical rack gear and engagement of the horizontal clocked gear with the horizontal rack gear, wherein the second direction is substantially perpendicular to the first direction.

19. The computer device carrier system of claim 18, wherein the clocked gear assembly includes:
a lever for controlling the vertical clocked gear and the horizontal clocked gear,
wherein the vertical clocked gear and the horizontal clocked gear are independently actuated by movement of the lever, the lever having a first pin configured to engage a first slot on the vertical clocked gear, and a second pin configured to engage a second slot on the horizontal clocked gear, and movement of the lever through a first arc causes the first pin to engage the first slot to move the vertical clocked gear and movement of the lever through a second arc causes the second pin to engage the second slot to move the horizontal clocked gear, and a cross-over point being defined when the first pin disengages from the first slot and the second pin engages the second slot.

20. In an integrated computer and server component rack, a storage array carrier system, comprising:
a carrier blade capable of receiving a plurality of storage devices and arranging the plurality of storage devices in a plurality of linear arrays;
a storage device frame attached to the carrier blade to position and to secure a storage device, the storage device frame including a clocked gear assembly having a vertical clocked gear and a horizontal clocked gear; and
a device collar coupled to the storage device, the device collar designed to be received in a track of the storage device frame, the device collar having a vertical rack gear and a horizontal rack gear, wherein the vertical rack gear meshes with the vertical clocked gear to move the storage device in a first direction and the horizontal rack gear meshes with the horizontal clocked gear to move the storage in a second direction substantially perpendicular to the first direction to position the storage device and to connect the storage device to, and disconnect the storage device from, a power and data connection.

21. In an integrated computer and server component rack, the storage array carrier system of claim 20, wherein the clocked gear assembly includes:
a lever for controlling the vertical clocked gear and the horizontal clocked gear,
wherein the vertical clocked gear and the horizontal clocked gear are independently actuated by movement of the lever to mesh with each of a vertical rack gear of the device collar and a horizontal rack gear of the device collar for inserting the storage device into and removing the storage device from a location in one of the plurality of linear arrays of storage devices without one of connecting and disconnecting another storage device.

* * * * *